United States Patent
Lim et al.

(10) Patent No.: US 8,242,872 B2
(45) Date of Patent: Aug. 14, 2012

(54) TRANSFORMER WITH EFFECTIVE HIGH TURN RATIO

(75) Inventors: Chee Chong Lim, Singapore (SG); Kok Wai Chew, Singapore (SG); Kiat Seng Yeo, Singapore (SG); Suh Fei Lim, Singapore (SG); Manh Anh Do, Singapore (SG); Lap Chan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 399 days.

(21) Appl. No.: 11/779,892

(22) Filed: Jul. 19, 2007

(65) Prior Publication Data
US 2008/0284553 A1 Nov. 20, 2008

Related U.S. Application Data

(63) Continuation-in-part of application No. 11/750,341, filed on May 18, 2007, now Pat. No. 7,570,144.

(51) Int. Cl.
*H01F 5/00* (2006.01)
*H01F 27/28* (2006.01)
(52) U.S. Cl. .......... 336/200; 336/223; 336/232
(58) Field of Classification Search .......... 336/200, 336/223, 232
See application file for complete search history.

(56) References Cited

U.S. PATENT DOCUMENTS

| | | | |
|---|---|---|---|
| 2,847,651 A * | 8/1958 | Schamanek | 336/200 |
| 4,616,205 A * | 10/1986 | Praught et al. | 336/82 |
| 6,031,445 A | 2/2000 | Marty et al. | |
| 6,114,937 A | 9/2000 | Burghartz et al. | |
| 6,476,704 B2 * | 11/2002 | Goff | 336/200 |
| 6,825,749 B1 | 11/2004 | Lin et al. | |
| 7,164,339 B2 * | 1/2007 | Huang | 336/200 |
| 2001/0050607 A1 | 12/2001 | Gardner | |
| 2003/0071706 A1 | 4/2003 | Christensen | |
| 2003/0229982 A1 | 12/2003 | Vilander et al. | |
| 2004/0017278 A1 | 1/2004 | Castaneda et al. | |
| 2004/0046630 A1 | 3/2004 | Gardner | |

(Continued)

FOREIGN PATENT DOCUMENTS
DE 10261385 7/2004
(Continued)

OTHER PUBLICATIONS

J. R. Long, Monolithic Transformers for Silicon RF IC Design, IEEE Journal of Solid-State Circuits, Sep. 2000, pp. 1368-1382, vol. 35, No. 9.

(Continued)

*Primary Examiner* — Anh Mai
*Assistant Examiner* — Ronald Hinson
(74) *Attorney, Agent, or Firm* — Horizon IP Pte Ltd

(57) ABSTRACT

Embodiments of the invention provide a transformer comprising: a first coil element having a transverse axis along a transverse direction, the first coil element having p turns where p is greater than or equal to 1; and a second coil element having a transverse axis generally parallel to the transverse axis of the first coil element, the second coil element having n turns, where n is greater than or equal to 5p; wherein the first and second coil elements are arranged to provide electromagnetic coupling between the coil elements along a portion of a length of the second coil element in both a transverse direction parallel to the transverse axes and a lateral direction, wherein the lateral direction is a direction normal to the transverse axes.

25 Claims, 8 Drawing Sheets

U.S. PATENT DOCUMENTS

| | | | |
|---|---|---|---|
| 2004/0056749 A1 | 3/2004 | Kahlmann et al. | |
| 2004/0095222 A1 | 5/2004 | Liang et al. | |
| 2005/0062575 A1* | 3/2005 | Gardner | 336/200 |
| 2005/0128038 A1 | 6/2005 | Hyvonen | |
| 2006/0001520 A1* | 1/2006 | Kaji et al. | 336/223 |
| 2007/0279176 A1* | 12/2007 | Chen et al. | 336/200 |

FOREIGN PATENT DOCUMENTS

| | | |
|---|---|---|
| EP | 0649152 A2 | 8/1990 |
| EP | 1032001 A1 | 8/2000 |
| GB | 2381129 | 4/2003 |
| WO | 0146971 A1 | 6/2001 |
| WO | 02065492 A2 | 8/2002 |

OTHER PUBLICATIONS

J. J. Zhou et al., Monolithic Transformers and Their Application in a Differential CMOS RF Low-Noise Amplifier, IEEE Journal of Solid-State Circuits, Dec. 1998, pp. 2020-2027, vol. 33, No. 12.

S. S. Mohan et al., Modeling and Characterization of On-Chip Transformers, 1998 International Electron Devices Meeting Technical Digest, Dec. 6-9, 1998, pp. 531-534.

I. Aoki et al., Fully Integrated CMOS Power Amplifier Design Using the Distributed Active-Transformer Architecture, IEEE Journal of Solid-State Circuits, Mar. 2002, pp. 371-383, vol. 37, No. 3.

J. R. Long et al., The Modeling, Characterization, and Design of Monolithic Inductors for Silicon RF IC's, IEEE Journal of Solid-State Circuits, Mar. 1997, pp. 357-369, vol. 32, No. 3.

Yo-Sheng Lin et al., Temperature-Dependance of Noise Figure of Monolithic RF Transformers on a Thin (20 um) Silicon Substrate, IEEE Electron Device Letters, Mar. 2005, pp. 208-211, vol. 26, No. 3.

Sang-Gug Lee, Area Efficient and Symmetric Design of Monolithic Transformers for Silicon RF ICs, Tencon 99. Proceedings of the IEEE Region 10 Conference, Dec. 1999, pp. 880-882, vol. 2.

\* cited by examiner

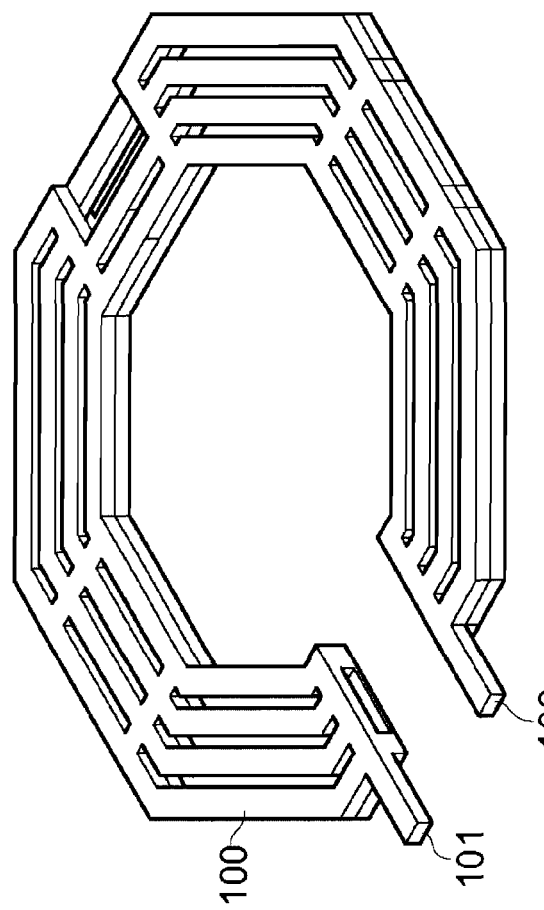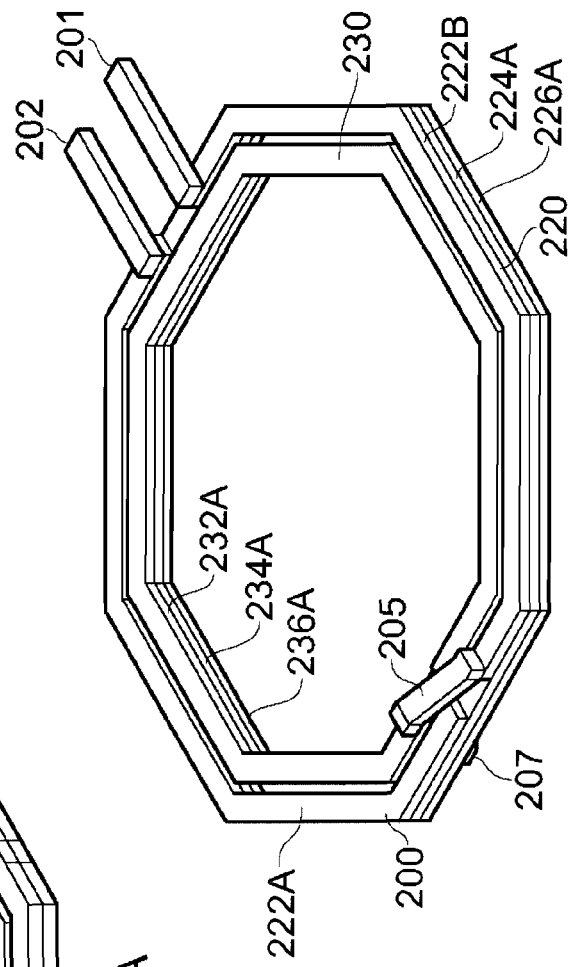
Fig. 2A
Fig. 2B

TRANSFORMER WITH EFFECTIVE HIGH TURN RATIO

FIELD OF THE INVENTION

The present invention relates to semiconductor integrated circuits. More particularly, the invention relates to a semiconductor integrated circuit having a transformer.

DESCRIPTION OF THE RELATED ART

Monolithic transformers are used in on-chip radio frequency (RF) integrated circuits (ICs) to perform a range of functions including impedance matching, signal coupling and phase splitting. Monolithic transformers provide a number of advantages for the circuit designer over conventional transformers including lower power consumption and higher packaging density. Monolithic transformers enable power amplifiers to be fabricated by standard CMOS processes.

However, power levels obtainable based on existing fully integrated amplifiers using a silicon substrate are too low to be considered for wireless applications. This is due to power losses caused by eddy currents induced in the silicon substrate by electromagnetic fields associated with coils of the transformer.

In order to reduce power losses, a variety of fabrication methods have been proposed, including methods involving special wafer-processing techniques such as thinning of the silicon substrate. These techniques are costly, however, and not readily compatible with foundry processing technologies.

Current fabrication techniques for monolithic transformer structures result in the primary and secondary coils being formed to have unequal physical lengths, resulting in a difference between the values of inductance of the coils. Furthermore, in the case of stacked transformer structures, differences in metallization thicknesses and distances between respective coils and the silicon substrate also cause discrepancies in transformer performance.

Examples of known integrated transformers include planar transformer structures that rely on coupling between coils located primarily in the same plane, i.e. lateral (or 'side') coupling between coils. US2003/0071706 discloses such a structure.

High turn ratio integrated transformers are usually relatively large in diameter, and therefore occupy relatively large areas of a substrate. For example, integrated transformers with a turn ratio R=25 may be 400 μm×400 μm in size.

In order to reduce the cost of IC fabrication, it is desirable to reduce the process complexity and overall size of the transformer. In addition, it is desirable to improve the performance characteristics of existing high turn ratio transformers. Transformers having increased turn ratios (that is, increased inductance ratios) without increasing the area consumed are particularly desirable.

SUMMARY OF THE INVENTION

It is an aim of the invention to mitigate at least some of the above mentioned problems. It is a further aim of the invention to provide an improved high turn ratio transformer.

Another aim of the present invention is to provide a method for making an improved high turn ratio transformer.

A still further aim of the present invention is to provide a high turn ratio integrated transformer having increased power efficiency. It is a further aim to provide a high turn ratio transformer having increased power efficiency that is compatible with standard CMOS deep-submicron fabrication processes.

According to one aspect of the present invention, there is provided a transformer comprising: a first coil element having a transverse axis along a transverse direction, the first coil element having p turns where p is greater than or equal to 1; and a second coil element having a transverse axis substantially parallel to the transverse axis of the first coil element, the second coil element having n turns, where n is greater than or equal to 5p; wherein the first and second coil elements are arranged to provide electromagnetic coupling between the coil elements along a portion of a length of the second coil element in both a transverse direction substantially parallel to said transverse axes and a lateral direction, wherein the lateral direction is a direction substantially normal to said transverse axes.

According to a second aspect of the invention, there is provided a transformer comprising: a first coil element having a transverse axis along a transverse direction, the first coil element having p turns where p=1 to 30; and a second coil element having a transverse axis generally parallel to the transverse axis of the first coil element, the second coil element having n turns, where n=10p to 500p, wherein the first and second coil elements are substantially coaxial and arranged to provide electromagnetic coupling between the coil elements along a portion of a length of the second coil element in both a transverse direction substantially parallel to said transverse axes and a lateral direction, the lateral direction being a direction substantially normal to said transverse axes, the first coil element comprising first, second and third portions, said first portion of the first coil element being provided adjacent to at least a portion of an outer peripheral edge of the second coil element, said first portion being arranged to provide electromagnetic coupling in a substantially lateral direction between the first and second coil elements, said second portion of the first coil element being provided adjacent to at least a portion of an inner peripheral edge of the second coil element, said second portion of the first coil being arranged to provide electromagnetic coupling in a substantially lateral direction between the first and second coil elements; and said third portion of the first coil element being mutually spaced apart from at least a portion of the second coil element along said transverse direction, the third portion being arranged to provide electromagnetic coupling in a substantially transverse direction between the first and second coil elements.

According to a third aspect of the invention there is provided a method of fabricating a transformer comprising the steps of: providing a first coil element having a transverse axis, the first coil element having p turns where p is greater than or equal to 1; and providing a second coil element having a transverse axis substantially parallel to said transverse axis of the first coil element, the second coil element having n turns, where n is greater than or equal to 5p; wherein the first and second coil elements are formed to provide electromagnetic coupling between the coil elements along a portion of a length of the second coil element in both a transverse direction substantially parallel to said transverse axis and a lateral direction substantially normal to said transverse axes.

According to a fourth aspect of the invention there is provided a method of fabricating a transformer comprising: providing a first coil element having a transverse axis, the first coil element having p turns where p=1 to 30; and providing a second coil element having a transverse axis substantially parallel to the transverse axis of the first coil element, the second coil element having n turns, where n=10p to 500p, whereby the first and second coil elements are substantially coaxial and formed to provide electromagnetic coupling between the coil elements along a portion of a length of the second coil element in both a transverse direction substantially parallel to said transverse axis and a lateral direction substantially parallel to a lateral plane, said lateral plane being substantially normal to said transverse axis.

A transformer is disclosed in yet another aspect of the invention. The transformer comprises a first coil and a second coil formed in a substrate. The second coil includes a plurality of n turns. The first coil surrounds the second coil to produce mutual inductance between the coils in multi-lateral directions to increase the effective turn ratio of the transformer.

Enhanced coupling can be provided between first and second coils of the transformer. This can be achieved at least in part by the use of a primary coil having at least a single turn that is arranged to couple to the secondary coil in both a lateral and a transverse direction. The primary coil can be arranged at least partially to surround the secondary coil, thereby to achieve coupling between the primary and secondary coils in both a lateral direction and a transverse direction. When the substrate is oriented in a horizontal direction with the transformer uppermost, the lateral direction is in a horizontal plane and the transverse direction is in a vertical plane.

Lateral and transverse coupling between coils according to embodiments of the invention has the advantage of increasing the effective turn ratio of the transformer. In addition, the size of an integrated transformer according to embodiments of the invention may be decreased for a given effective turn ratio, that is, for a given effective inductance ratio.

BRIEF DESCRIPTION OF THE DRAWINGS

Embodiments of the present invention will now be described hereinafter, by way of example only, with reference to the accompanying drawings, in which:

FIGS. 2A and 2B are schematic illustrations of a primary coil and secondary coil respectively of the transformer of FIG. 1;

DETAILED DESCRIPTION OF THE INVENTION

The following embodiments are intended to illustrate the invention more fully without limiting their scope, since numerous modifications and variations will be apparent to those skilled in the art.

Figure 1:
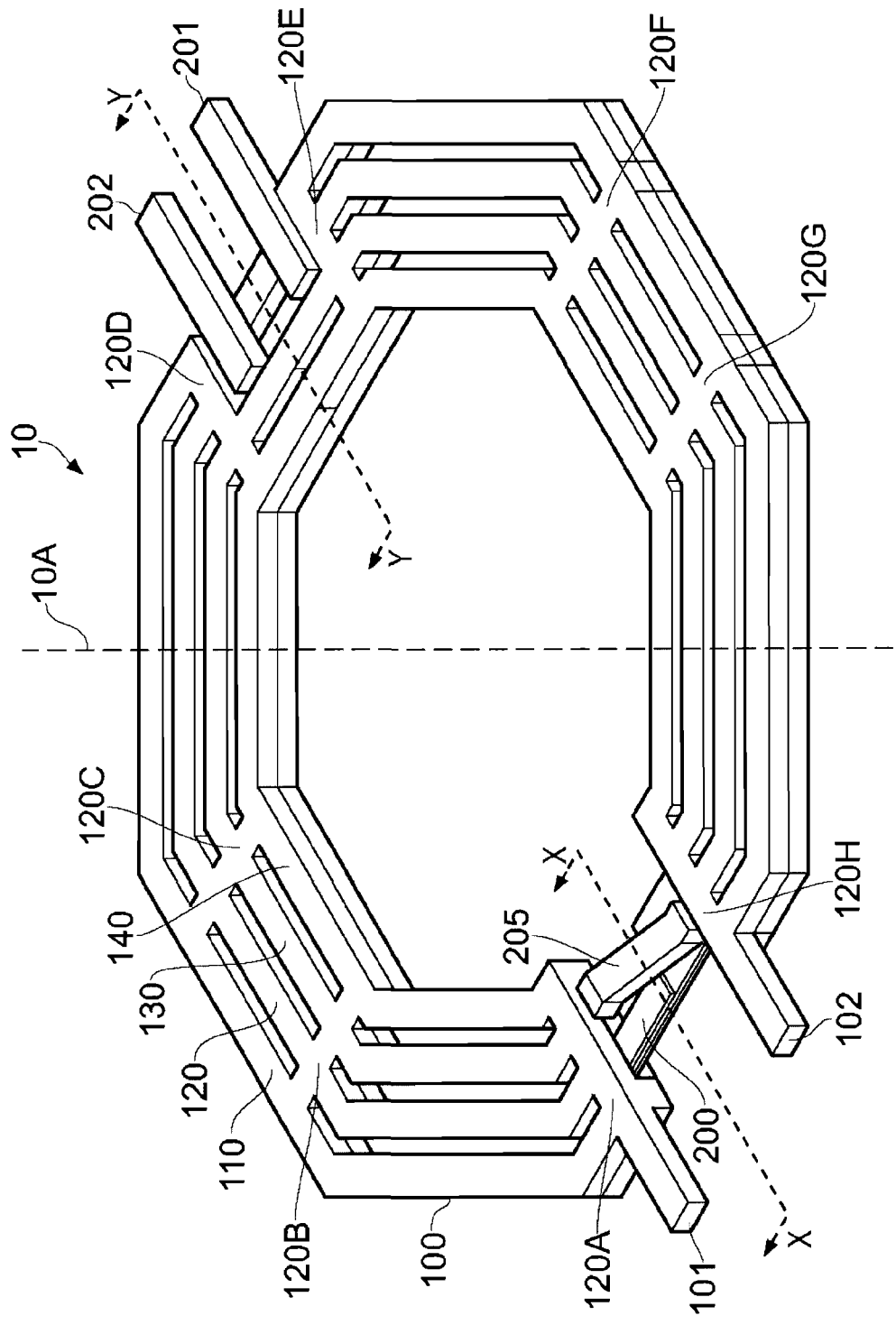
FIG. 1 is a schematic illustration of an integrated transformer according to a first embodiment of the invention.

FIG. 1 shows a transformer 10 according to a first embodiment of the invention. The transformer 10 has first and second coils 100 and 200. One of the coils forms a primary coil while the other forms a secondary coil. In one embodiment, the first coil comprises a primary coil while the second coil comprises a secondary coil. Alternatively, the first coil forms a secondary coil and the second coil forms a primary coil. The coils are formed on a substrate. The coils can be made from copper. Other conductive materials, such as aluminium, are also useful. Although preferable, it is not necessary that the coils are made of the same material. In one embodiment, the coils are formed on a semiconductor substrate of an integrated circuit (IC). The IC, for example, comprises an RF IC. Other types of ICs are also useful. Preferably, the coils are formed in the various metal layers of the IC.

The coils comprise a ring shape to form one or more loops (turns) of the coils. For example, as shown, the coils are generally octagonal shape when viewed along a direction normal to a plane of a substrate on which the transformer 10 is formed. This direction is a direction parallel to a transverse axis 10A of the transformer 10. Other geometric shapes, such as circular for forming loops of the coils are also useful. Although preferable, it is not necessary that the coils comprise the same shape.

In one embodiment, the first coil 100 comprises p loops, where p is equal to at least one. For the case where p=1, the loop is substantially about 360°, with an opening separating the ends of the first coil. Preferably, p is equal to 1, with first and second ends separated by an opening. The secondary coil comprises a plurality of n loops. Generally, the inductance of a coil is dependent on its length.

The inductance ratio R, also referred to as turn ratios of the transformer is defined as:

$$R = \frac{L_S}{L_F}$$

where
  $L_S$ is equal to the inductance of the second coil; and
  $L_F$ is equal to the inductance of the first coil.

In accordance with one embodiment of the invention, the first coil encloses the second coil. For example, the first coil encloses one side and the top of the second coil. Preferably, the first coil encloses the sides and top of the second coil. Preferably, the second coil is entirely enclosed within the first coil. For example, the first coil encloses the sides, top and bottom of the second coil.

Enclosing the second coil within the first coil produces mutual inductance between the coils in multi-lateral directions. For example, mutual inductance is produced in the horizontal and vertical directions. Producing mutual inductance in other directions is also useful. Preferably, mutual inductance is produced all around to increase the inductance ratio of the transformer. This, in turn, increases the effective turn ratio E. The effective turn ratio E is defined as:

$$E = \sqrt{R} = \sqrt{\frac{L_S}{L_F}}$$

where
  R is the inductance ratio
  $L_S$ is equal to the inductance of the second coil; and
  $L_F$ is equal to the inductance of the first coil.

The increase in inductance ratio can produce a transformer with desired effective turn ratio using a shorter second coil. This reduces the physical size of the transformer.

In one embodiment, the n turns of the second coil are grouped into g groups, where g is equal to at least 1. Preferably, g is greater than 1. For g>1, the groups are arranged in concentric groups. The turns within a group are stacked in registration in the different metal layers. Generally, the number of turns in a group is limited by the number of metal layers in the IC. For example, the number of turns in a group is equal to m−1 turns, where m is equal to the number of metal layers in the IC. Preferably, the number of turns in a group is equal to m−2 turns. Preferably, the number of turns in the groups is the same. Other configurations of turns and metal layers are also useful, including groups with different number of turns. Providing groups of turns stacked in registration increases self-inductance to increase the inductance ratio of the transformer. Preferably, providing concentric groups of turns in registration produces self inductance in multi-lateral directions, increasing the inductance of the second coil. This results in further increasing the inductance ratio of the transformer.

In one embodiment, the second coil comprises six turns. The turns, for example, are formed into two groups of three turns each for an IC having 5 metal layers. The first group is within the second group, forming concentric groups. The groups are arranged to form continuous loops, enabling current to flow in the same direction from a first to a second end of the second coil.

In one embodiment, the first and second groups comprise metal lines arranged in concentric rings. In one embodiment, the concentric rings are octagonal shaped rings. The metal lines comprise an octagonal shape. For an IC with 5 metal layers, each group includes three metal lines located in the $2^{nd}$ through $4^{th}$ metal layers. The metal lines are disposed one above the other in registration. The top metal line of the first or outer group comprises first and second halves, with openings at opposing sides of the ring. Terminals are coupled to first ends of the halves located on one of the opposing sides.

The second metal ring below the top metal line is substantially enclosed, with an opening forming first and second ends. Likewise, the third metal ring below the second metal ring is substantially enclosed with first and second ends. The second end of the first half of the top metal line is coupled to a first end of the second metal line below by a contact. The second end of the second metal line is coupled to the first end of the third metal line below.

The second or inner group comprises metal lines which are substantially enclosed with first and second ends. The second end of the third metal line of the first group is coupled to the first end of the third metal line of the second group. The metal lines of the second group are interconnected by contacts. For example, the second end of the third metal line is coupled to the first end of the second metal line by a contact. The second end of the second metal line is coupled to first end of the top metal line.

In one embodiment, cross-over contact is provided to couple the second end of the top metal line of the first group to the second end of the second half of the top metal line of the first group, completing the continuous loops of the second coil. The cross-over contact and terminals are provided in, for example, the $5^{th}$ or top metal layer of the IC and are interconnected to the $4^{th}$ metal layer by contacts. Other coil routings and/or configurations are also useful. For example, more than 2 groups of metal lines can be provided. Other number of metal lines within a group and/or other numbers of metal layers can also be provided.

FIGS. 2A and 2B show first and second coils in accordance with one embodiment of the invention in greater details. In one embodiment, the first coil for example, forms the primary coil while the second coil forms the secondary coil of the transformer. The primary coil 100 has a pair of terminals 101, 102 at opposed ends of the coil, as shown in FIG. 2A. The secondary coil has a corresponding pair of terminals 201, 202, as shown in FIG. 2B.

Figure 3:
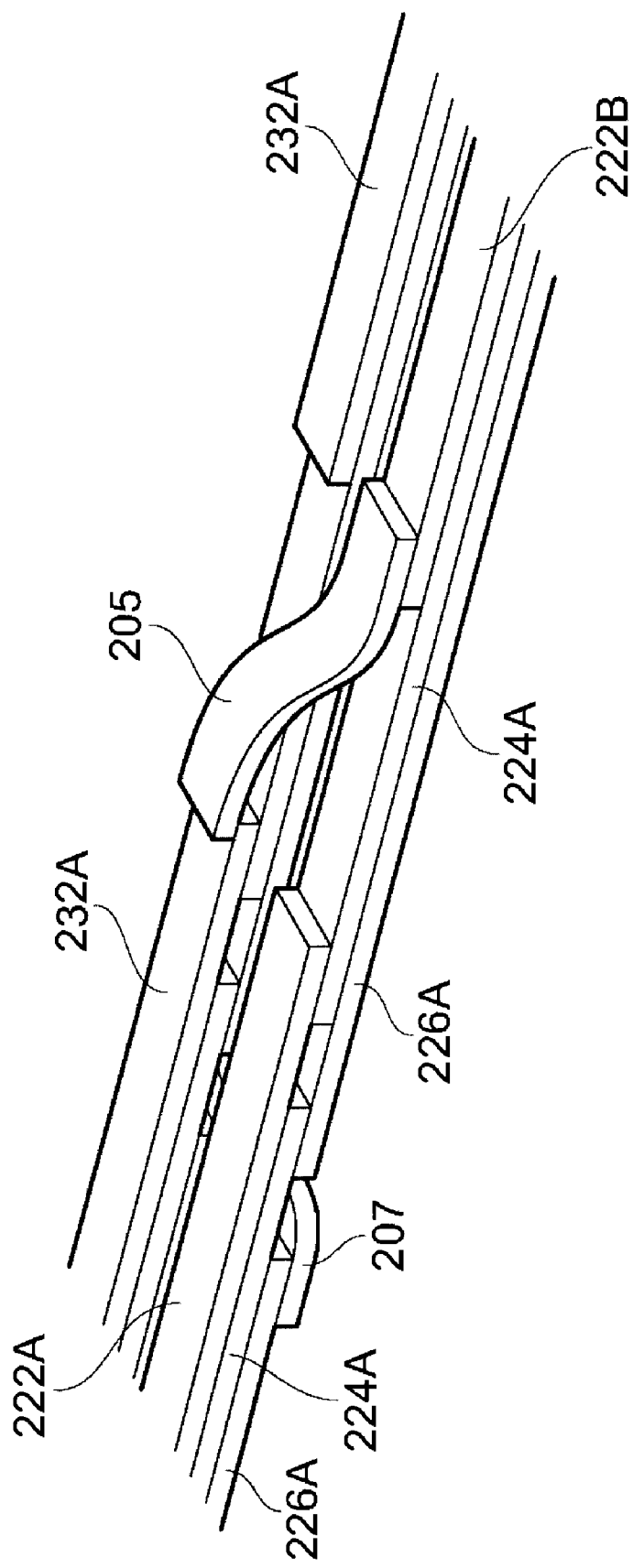
FIG. 3 is a schematic illustration of a portion of the secondary coil of the transformer of FIG. 1.
Figure 4:
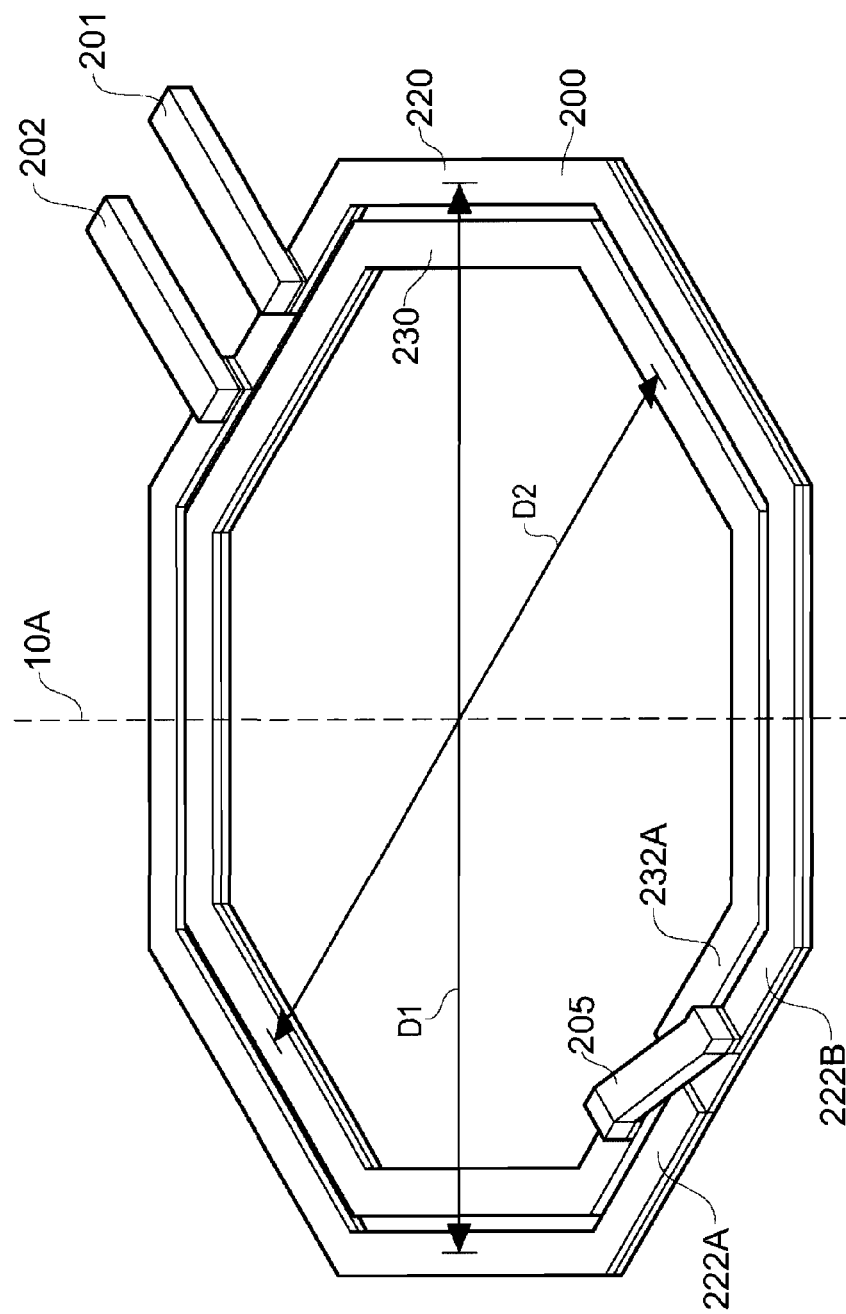
FIG. 4 is a schematic illustration of the secondary coil of the transformer of FIG. 1.

In accordance with one embodiment of the invention, as illustrated in FIGS. 2B, 3 and 4, the secondary coil 200 has a conducting track that describes six turns of substantially 360° each. The turns are arranged in two groups of three turns, respective groups being concentric about the transverse axis 10A. Turns of a group are stacked in mutual registration in a direction parallel to the transverse axis 10A.

Referring to FIG. 4, the secondary coil has two groups of three turns; the first group 220 having a distance D1 between the mid-points of diametrically opposed, generally parallel sides. The second group 230 has a distance D2 between the mid-points of diametrically opposed, generally parallel sides that is less than D1.

Referring to FIG. 2B, the groups 220, 230 are distributed over three mutually parallel, substantially planar spaced lateral levels, namely a first lateral level 222, a second lateral level 224, and a third lateral level 226. A leading portion of the secondary coil 222A turns through substantially 180° and is provided on the first lateral level 222. The leading portion 222A of the secondary coil 200 is connected at a first end to terminal 202 of the secondary coil. At a second end of the leading portion 222A of the secondary coil 200 opposite the first end, the leading portion is connected to a first end of a first substantially full turn 224A of the secondary coil provided on the second lateral level 224.

Figure 5B:
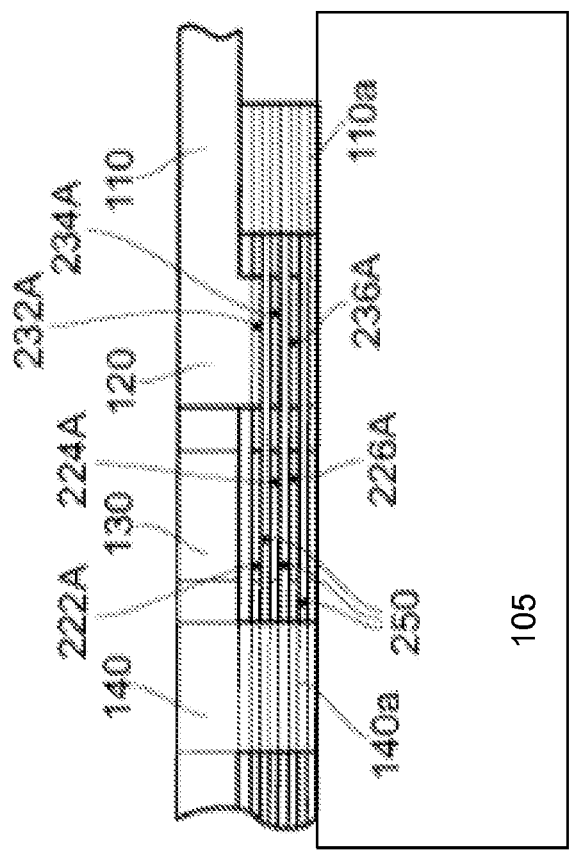
FIGS. 5A and 5B are cross-sectional schematic diagrams along lines X—X and Y—Y respectively of FIG. 1.
Figure 5A:
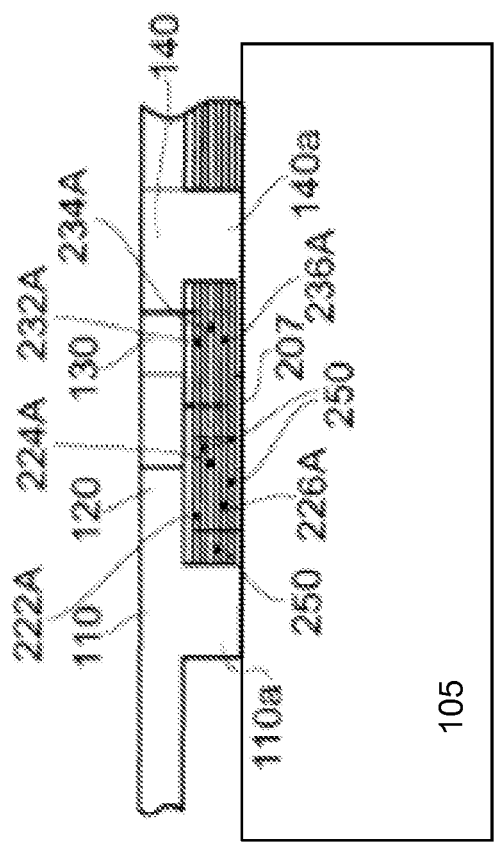

Respective lateral levels are separated from one another by a layer of an insulating medium 250, as shown in FIG. 5A. Thus, the second lateral level 224 is separated from the first lateral level 222 by a layer of insulating medium 250. In one embodiment, the insulating medium 250 comprises $SiO_2$. In alternative embodiments, the insulating medium is porous $SiO_2$, a further oxide material, a nitride material, or any other suitable insulating medium, for example a mixture of oxide and nitride materials. For example, the insulating medium may be a composite of both porous $SiO_2$ layers and SiN layers.

Referring back to FIG. 2B, a second end of the first substantially full turn 224A opposite the first end is connected to a first end of a second substantially full turn 226A of the secondary coil 200 on the third lateral level 226. A second end of the second substantially full turn 226A is connected to a first end of a third substantially full turn 236A of the secondary coil. The third substantially full turn 236A is also provided on the third lateral level and is a member of the second group of turns 230, having a distance D2 between the mid-points of diametrically opposed, generally parallel sides. In other words, the second and third substantially full turns are concentric and provided on the same lateral level.

As shown in FIGS. 3 and 5A, adjacent ends of the second and third full turns 226A, 236A are connected by means of a cross-over element 207. The crossover element 207 is provided below the second and third full turns 226A, 236A with respect to a secondary coil oriented in a horizontal plane with the second lateral level above the third lateral level.

A fourth substantially full turn 234A of the secondary coil 200 also has a diameter D2. It is provided on the second lateral level 224 and is connected at a first end to a second end of the third substantially full turn 236A. A fifth substantially full turn 232A of the secondary coil 200 of diameter D2 is provided on the first lateral level and is connected at a first end to a second end of the fourth substantially full turn 234A. A second end of the fifth substantially full turn 232A opposite the first end is connected to a first end of a second portion 222B of the secondary coil 200 on the first lateral level 222.

The second portion 222B is a member of the first group of turns, having a diameter D1. The second portion 222B turns through an angle of substantially 180° and is generally symmetrical with respect to the first portion 222A.

The first end of the trailing portion 222B is connected to the second end of the fifth substantially full turn 232A by means of a crossover element 205. The second end of the trailing portion is connected to terminal 201 of the secondary coil 200. The crossover element 205 is provided above the first lateral level, with respect to a secondary coil oriented in a horizontal plane and having the second lateral level above the third lateral level, as shown in the figures.

Crossover elements 205, 207 link respective first and second groups of the secondary coil in order to facilitate a coplanar structure. The structure resembles a figure of 8 folded in half to form two groups of concentric, coplanar turns 220, 230.

The primary coil 100 is in the form of four coplanar concentric tracks 110, 120, 130, 140 of decreasing radii, as shown in FIG. 1. Tracks 120, 130 have distances D1, D2, respectively between the mid-points of diametrically opposed, generally parallel sides. The spacings between tracks 110, 120, 130, 140 are substantially equal, in accordance with one embodiment of the invention.

The tracks 110, 120, 130 and 140 are provided on a lateral level spaced apart from the first lateral level 222 of the secondary coil and in juxtaposition with the first lateral level 222. With the substrate oriented in a horizontal plane, such that the transformer is on an uppermost surface of the substrate, tracks 120, 130 of the primary coil are arranged to directly overlie turns 220, 230 respectively, of the secondary coil.

According to the present embodiment, D1 has a value of 134 µm whilst D2 has a value of 158 µm. Other values are also useful. The width of each track is 10 µm, in accordance with one embodiment.

It will be appreciated that the thickness of the conducting tracks will be process dependent. For 0.18 µm and 0.13 µm technology, the top metal layer (TM), which forms portions of each coil on the first lateral level, has a thickness in the range 2 to 3 µm. The portions of each coil on the second and third lateral levels have a thickness in the range of 0.154 to 0.465 µm. The insulation medium between the lateral levels has a thickness in the range of 0.4 µm to 0.9 µm.

It will be appreciated that the values of track thickness and track width are not intended to be limiting but are merely illustrative, and some embodiments of the invention have values of each respective parameter that are larger or smaller than the values given above.

Electrically conducting crossmember elements 120A, 120B, 120C, 120D, 120E, 120F, 120G and 120H are provided, as shown in FIG. 1. The crossmember elements are arranged in pairs and link each of the respective concentric tracks 110, 120, 130, 140 along a generally radial direction. A cage-like structure is thereby formed, that encloses the primary coil. This results in a primary coil of lower inductance that enhances the effective turn ratio (or inductance ratio) of the transformer.

It will be appreciated that in alternative embodiments of the invention, the number of tracks need not be equal to four. A greater or smaller number of tracks may be provided. Furthermore, the tracks need not be strictly concentric or coaxial. In some embodiments of the invention, concentric tracks 110, 120, 130, 140 may be replaced by a single continuous planar conducting member, such as a continuous planar member of hexagonal or annular shape. In further alternative embodiments, a single continuous planar conducting member is provided, the member having apertures provided therein.

It will furthermore be appreciated that the number of crossmember elements need not be equal to eight. Any suitable number of crossmember elements may be used. Furthermore, whilst the crossmember elements according to the present embodiment are arranged in a generally symmetrical manner, it will be appreciated that in alternative embodiments the crossmember elements are not arranged in a symmetrical manner.

FIG. 5A shows a cross-sectional view along line X-X of FIG. 1, and FIG. 5B shows a cross-sectional view along line Y-Y of FIG. 1. Respective layers of insulating medium 250 are indicated in FIGS. 5A and 5B. The transformer is disposed on a substrate 105 prepared with a dielectric layer.

Tracks 110 and 140 extend in a transverse direction to the third lateral level 226 of the secondary coil, thereby defining skirt members 110a, 140a, respectively, of the primary coil. Tracks 110, 140 and associated skirt members 110a, 140a, together with tracks 120 and 130 thereby define a primary coil 100 that surrounds the secondary coil 200 on three sides.

It will be appreciated by persons skilled in the art that in alternative embodiments of the invention the skirt member need not be a continuous member as in the case of a structure according to the first embodiment. For example, the skirt member may have one or more apertures therethrough.

In some embodiments of the invention, the skirt member may include a conducting track formed in or proximate to the second lateral level 224. In some embodiments, the skirt member may further include a conducting track formed in or proximate to the third lateral level 226.

In some embodiments of the invention, the primary coil is also provided with one or more members spaced from the secondary coil on an opposite side of the secondary coil to the concentric tracks 110, 120, 130, 140. Consequently, the secondary coil is surrounded on four sides by portions of the primary coil. Said one or more members on said opposite side may be in the form of a single planar element. In other words, said one or more members may be a continuous, 'solid' planar element. In some embodiments, a corresponding planar element is also provided in place of the concentric tracks 110, 120, 130, 140.

The transformer 10 according to the first embodiment is fabricated so that the crossover elements 205, 207 of the secondary coil are located between terminals 101, 102 of the primary coil on one of the eight sides of the primary coil. The crossover elements are provided on an opposite side of the secondary coil 200 to the terminals 201, 202 of the secondary coil. It will be appreciated that in alternative embodiments, the crossover elements 205, 207 are not provided between terminals 101, 102 of the primary coil. Furthermore, in some embodiments the crossover elements are not provided on an opposite side of the secondary coil to the terminals 201, 202.

Figure 6:
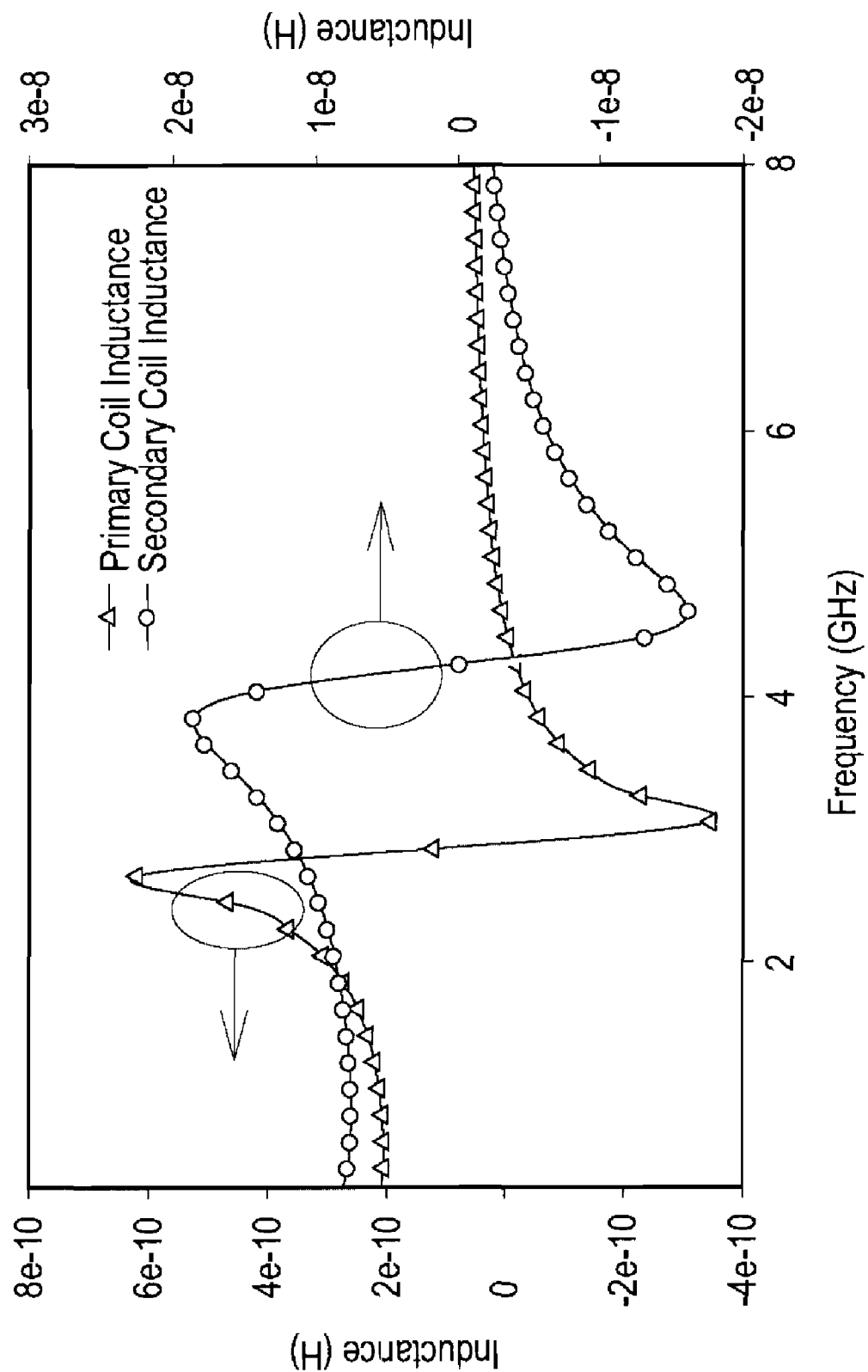
FIG. 6 is a graph of inductance as a function of frequency for primary and secondary coils of the transformer of FIG. 1.

FIG. 6 shows a simulation of a transformer in accordance with one embodiment of the invention. The simulation plots the inductance (in henries (H)) of the primary and secondary coils, respectively, as a function of frequency (in GHz). It is clear that relatively high values of inductance of the secondary coil are obtainable by the present invention.

It will be appreciated by persons skilled in the art that embodiments of the invention are not limited to a primary coil having one turn and a secondary coil having six turns. One or each of the coils can have a greater or smaller number of turns, provided that these obey the general relation $n \geq 5p$ (where n is equal to the number of turns of the secondary coil and p is equal to the number of turns of the primary coil). Alternatively, for a transformer in which the primary coil is enclosed within the secondary coil, n is equal to the number of turns of the primary coil while p is equal to the number of turns in the secondary coil.

Furthermore, the shape of each coil need not be the same, although advantageously the coils are of similar shape or identical shape in order to provide improved coupling between the coils. According to the first embodiment, the coils are of generally octagonal shape, having eight sides. In alternative embodiments, the coils may have any suitable number of sides, for example seven sides, six sides, or any other suitable number. In some embodiments of the invention, the coils are generally circular in shape.

Furthermore, the coils may be formed of conducting elements of any suitable cross-sectional shape, including rectangular, square, round, oval, polygonal, elliptical or any other suitable shape.

Figure 7:
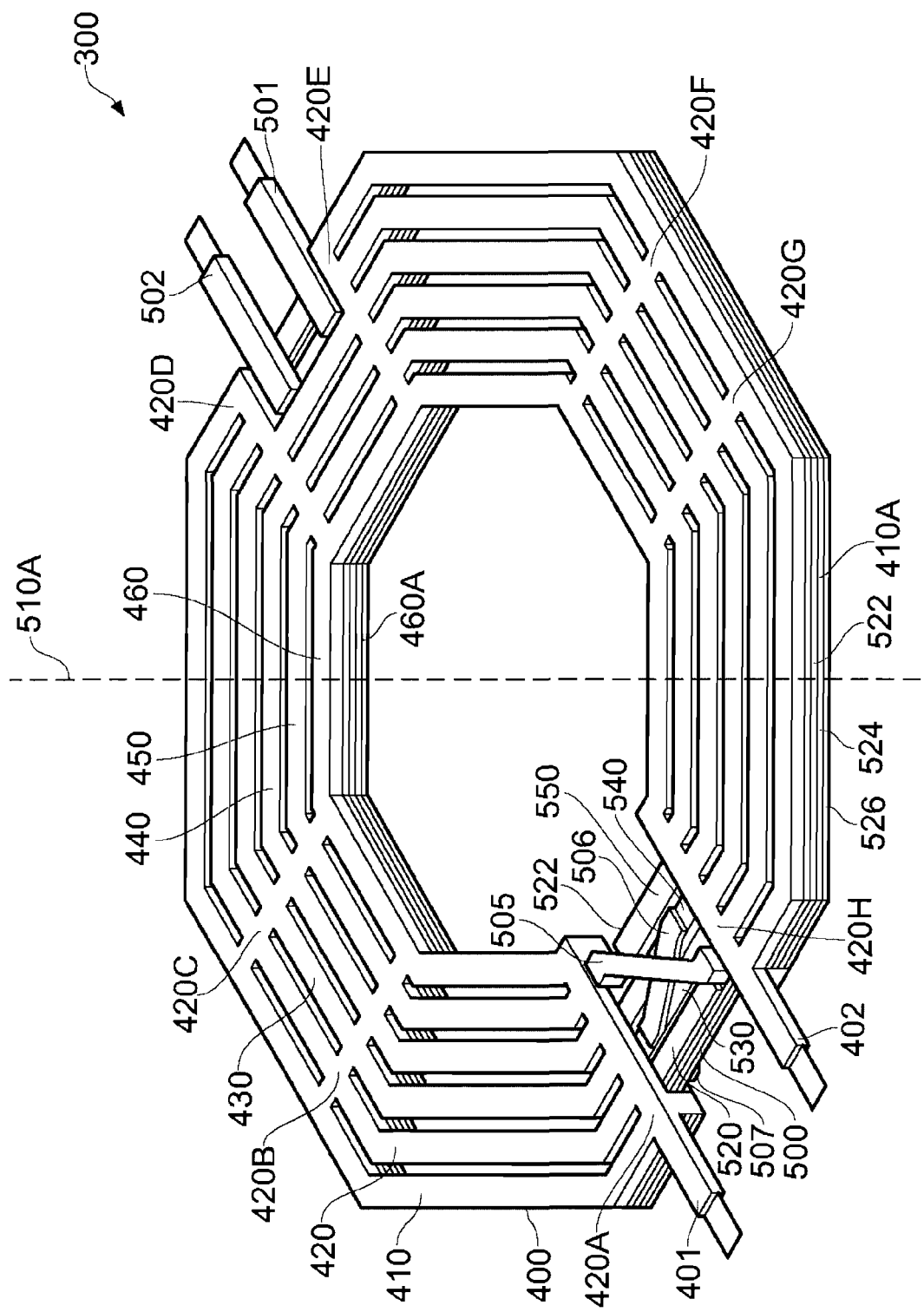
FIG. 7 is a schematic illustration of a transformer according to a second embodiment of the invention.

FIG. 7 shows a transformer 300 according to another embodiment of the invention. The transformer has a first coil 400 and a second coil 500. One of the coils forms a primary coil while the other forms a secondary coil. In one embodiment, the first coil comprises a primary coil while the second coil comprises a secondary coil. The primary coil 400 has a pair of terminals 401, 402 at opposed ends of the primary coil and the secondary coil 500 has a corresponding pair of terminals 501, 502 as illustrated in FIG. 7. The structure is similar to that of the first embodiment except that the secondary coil has four concentric groups of three turns 520, 530, 540, 550 and the primary coil has six concentric tracks 410, 420, 430, 440, 450, 460 which are linked together by eight cross members 420A, 420B, 420C, 420D, 420E, 420F, 420G and 420H.

The secondary coil is provided on three mutually parallel, spaced apart lateral levels, 522, 524, 526, oriented normal to a transverse axis 510A.

Each of crossmember elements 420A-H connects each of the six concentric tracks of the primary coil together. The crossmember elements are oriented generally perpendicular to the side of the transformer along which they are located, along a generally radial direction. Alternate sides of the turns are provided with a pair of crossmember elements at generally opposite ends of each side.

Concentric tracks 410, 420, 430, 440, 450 and 460 of the primary coil are in juxtaposition with and spaced apart from a first lateral level 522 of the secondary coil 500. Furthermore, outermost and innermost tracks of the primary coil 410, 460, respectively, are provided with skirt members 410A, 460A. The skirt members extend downwardly to a third lateral level 526 on which a portion of the secondary coil 500 is provided that is furthest from concentric tracks 420, 430, 440, 450.

Tracks 410, 460 and associated skirt members 410A, 460A, together with tracks 420, 430, 440 and 450 thereby define a primary coil 400 that surrounds the secondary coil 500 on three sides.

Crossover elements 505, 506, 507 in FIG. 7, link respective groups of the secondary coil in order to facilitate a coplanar structure.

Figure 8:
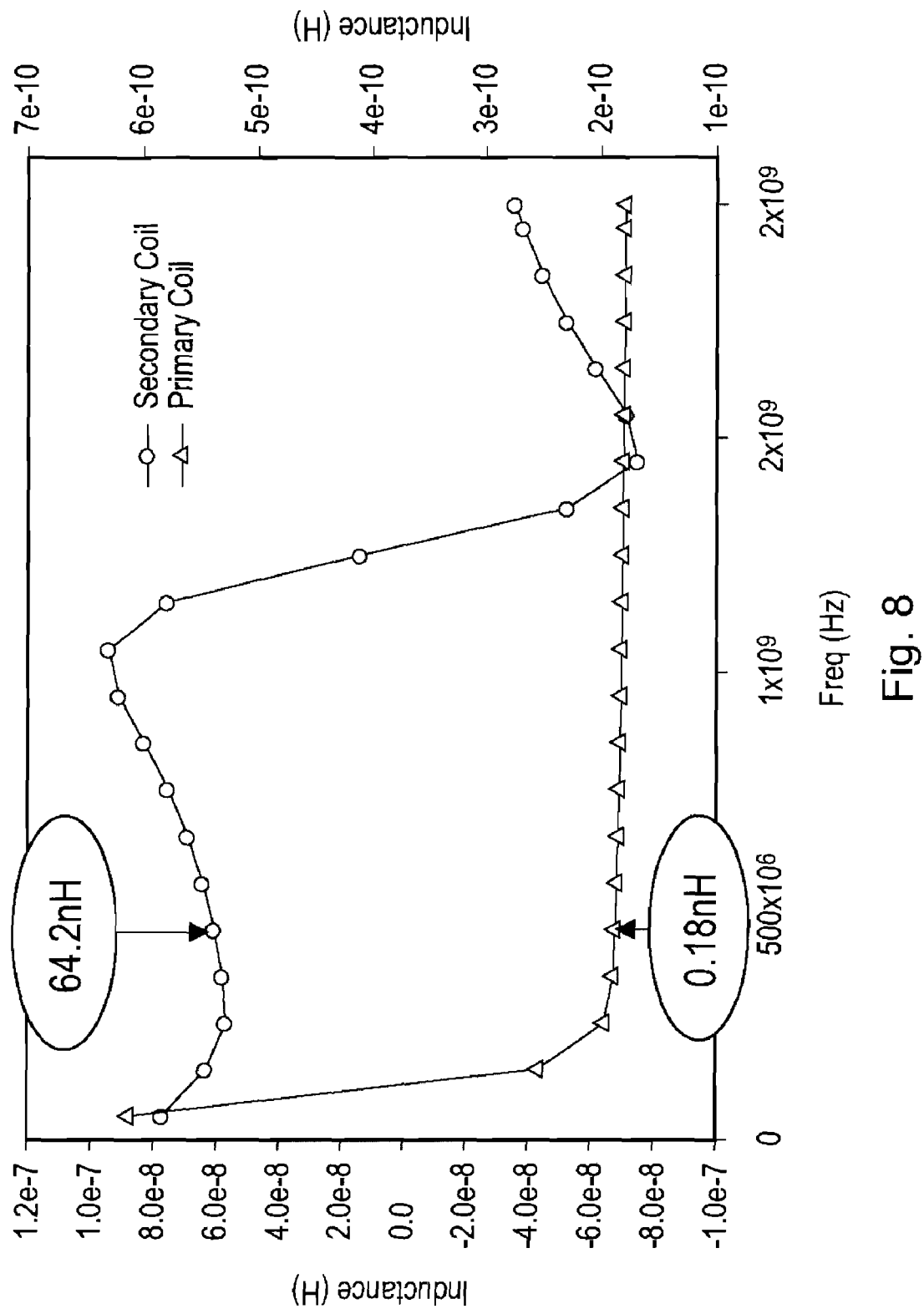
FIG. 8 is a graph of inductance as a function of frequency for primary and secondary coils of the transformer of FIG. 7.

FIG. 8 shows a simulation of a transformer in accordance with one embodiment of the invention. The simulation plots the inductance (in henries (H)) of the primary and secondary coils, respectively, as a function of frequency (in GHz). Again, it may be seen from the figure that the present invention can achieve relatively large values of inductance of the secondary coil.

Some embodiments of the invention have the advantage that the effective turn ratio of the integrated transformer is larger than the effective turn ratio of a conventional transformer structure. For example, transformer structures constructed according to the first embodiment may achieve inductance ratios in excess of around 40:1. Transformer structures constructed according to the second embodiment of the invention may achieve inductance ratios in excess of 350:1. The values of inductance obtainable render embodiments of the present invention suitable for use as on-chip RF chokes (DC feed).

The first embodiment of the invention described above is provided with a secondary coil having six turns, whilst the secondary coil of the second embodiment is provided with twelve turns. It will be appreciated that in alternative embodiments of the invention, the secondary coil may have three turns, five turns, seven turns or any other suitable number of turns. Furthermore, the number of turns need not be a whole number. Coils according to some embodiments may have a fractional number of turns, for example 2.5 turns, or any other suitable number of turns.

It will also be appreciated that the primary coil may have more than one turn, since $p \geq 1$.

Reference to a primary coil and a secondary coil having an integer multiple of turns each of 360° includes primary and secondary coils according to the first and second embodiments of the invention. It will of course be appreciated that, strictly, such coils do not have an integer multiple of coils of exactly 360°, since a gap in one turn is required in order to provide terminals to each of the coils. However, the presence of this gap has been ignored for the purposes of defining the number of turns.

In some embodiments of the invention, a primary coil is provided having a number of turns p, where p=1 to 30. According to some of these embodiments, the secondary coil has a number of turns n, where n=5p to 1000p. According to some of these embodiments, n=10p to 500p.

It will be appreciated that structures according to the first embodiment of the invention may be fabricated on an area of a silicon substrate of around 200 μm×200 μm or less. Structures according to the second embodiment of the invention may be fabricated on an area of a silicon substrate of around 240 μm×240 μm or less.

It will be appreciated that in some embodiments of the invention, the secondary coil is only surrounded by the primary coil on two sides. For example, a primary coil may have skirt portions along only one of two sides of the secondary coil, in conjunction with a portion directly above or directly below the secondary coil, with respect to a structure oriented according to the accompanying drawings.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. An integrated transformer comprising:
a semiconductor substrate prepared with a dielectric layer having a plurality of intermediate coil levels between top and bottom coil levels, the coil levels are separated by dielectric material of the dielectric layer, the coil levels are disposed along a transverse direction;
a first coil element having n turns in the dielectric layer, the first coil element includes
top first conductive concentric ring structures disposed in the top coil level, wherein dielectric material of the dielectric layer fills spaces between the top concentric ring structures, the top concentric ring structures include a plurality of inner top ring structures between innermost and outermost top ring structures,
bottom first conductive concentric ring structures disposed in the bottom coil level, wherein dielectric material of the dielectric layer fills spaces between the bottom concentric ring structures, the bottom concentric ring structures include a plurality of inner bottom ring structures between innermost and outermost bottom ring structures,
the top first concentric ring structures in the top coil level are in registration with the bottom first concentric ring structures in the bottom coil level,
the top innermost ring structure of the first coil element is electrically coupled to the bottom first innermost ring structure of the first coil element and the top innermost ring structure of the first coil element is electrically coupled to the bottom innermost ring structure of the first coil element by innermost and outermost transverse connectors,
the top first concentric ring structures are electrically coupled by top lateral connectors and the bottom first concentric ring structures are electrically coupled by bottom lateral connectors, wherein lateral connectors are separated from adjacent lateral connectors by dielectric material of the dielectric layer, and
wherein the first top and bottom concentric ring structures form a cage like structure with perforations filled with dielectric material of the dielectric layer;
a second coil element having second concentric conductive ring structures disposed in the plurality of intermediate coil levels in registration with the inner top and inner bottom ring structures of the first coil element to form second concentric ring stack groups, the second concentric ring stack groups are enclosed within the cage like structure of the first coil element, the second concentric ring stack groups are configured to form n turns for the second coil element; and
wherein the first and second coil elements are arranged to increase mutual inductance of the coil elements in a multilateral direction to increase effective turn ratio of the integrated transformer.

2. The transformer of claim 1 wherein:
n is an integer; and
p is an integer and is greater than or equal to 5n.

3. The transformer of claim 2 wherein n=1 to 30.

4. The transformer of claim 2 wherein p=5n to 1000n.

5. The transformer of claim 2 wherein p=10n to 500n.

6. The transformer of claim 1 wherein the first and second coil elements are substantially coaxial.

7. The transformer of claim 1 wherein a first portion of the first coil element is adjacent to at least a portion of an outer peripheral edge of the second coil element, the first portion of the first coil element being arranged to provide electromagnetic coupling in a substantially lateral direction between the first and second coil elements.

8. The transformer of claim 1 wherein a second portion of the first coil element is adjacent to at least a portion of an inner peripheral edge of the second coil element, the second portion of the first coil element being arranged to provide electromagnetic coupling in a substantially lateral direction between the first and second coil elements.

9. The transformer of claim 1 wherein a third portion of the first coil element is mutually spaced apart from at least a portion of the second coil element along said transverse direction, the third portion of the first coil element being arranged to provide electromagnetic coupling in a substantially transverse direction between the first and second coil elements.

10. The transformer of claim 7 wherein the first portion of the first coil element comprises a skirt portion extending from a third portion of the first coil element.

11. The transformer of claim 8 wherein the second portion of the first coil element comprises a skirt portion extending from a third portion of the first coil element.

12. The transformer of claim 9 wherein the third portion of the first coil element comprises a plurality of concentric tracks.

13. The transformer of claim 9 wherein the third portion of the first coil element comprises a continuous planar sheet.

14. The transformer of claim 9 wherein a fourth portion of the first coil element is mutually spaced apart from at least a portion of the second coil element along said transverse direction on an opposite side of the secondary coil to said third portion of the first coil element.

15. An integrated transformer comprising:
a substrate with a dielectric layer thereon having an intermediate coil level between top and bottom coil levels;
a first coil with top and bottom first conductive concentric rings in the top and bottom coil levels, the first conductive concentric rings are interconnected to form a perforated cage like structure; and
a second coil with second concentric rings which form p turns, the second concentric rings are in registration with inner top and bottom first concentric rings in the intermediate coil level and are enclosed within the perforated cage like structure of the first coil to produce mutual inductance between the coils in multi-lateral directions to increase the effective turn ratio of the transformer.

16. A method of fabricating an integrated transformer comprising:
providing a semiconductor substrate prepared with a dielectric layer having intermediate coil levels between top and bottom coil levels along a transverse direction;
forming a first coil with top and bottom first conductive concentric rings in the top and bottom coil levels, the first conductive concentric rings are interconnected to form a perforated cage like structure; and
forming a second coil with second concentric rings which form p turns, the second concentric rings are in registration with inner top and bottom first concentric rings in the intermediate coil level and is enclosed within the perforated cage like structure of the first coil to produce mutual inductance between the coils in multi-lateral directions to increase the effective turn ratio of the transformer.

17. The method of claim 16 wherein:
the first coil comprises n turns, where n is an integer greater than or equal to 1; and
p is equal to at least 5n.

18. The method of claim 17 wherein n=1 to 30.

19. The method of claim 17 wherein p=5n to 1000n.

20. The method of claim 17 wherein p=10n to 500n.

21. The method of claim 16 wherein a second portion of the first coil is adjacent to at least a portion of an inner peripheral edge of the second coil, the second portion of the first coil being arranged to provide electromagnetic coupling in a substantially lateral direction between the first and second coils.

22. The method of claim 16 wherein a third portion of the first coil is mutually spaced apart from at least a portion of the second coil along said transverse direction, the third portion of the first coil being arranged to provide electromagnetic coupling in a substantially transverse direction between the first and second coils.

23. The transformer of claim 1 wherein the first coil comprises a plurality of interconnected concentric first conductive rings.

24. The integrated transformer of claim 15 wherein the first coil comprises a plurality of interconnected concentric first conductive rings.

25. The method of claim 16 wherein the first coil comprises a plurality of interconnected concentric first conductive rings.

* * * * *